(12) United States Patent
Moritsuka et al.

(10) Patent No.: US 8,489,030 B2
(45) Date of Patent: Jul. 16, 2013

(54) RADIO APPARATUS HAVING FIRST AND SECOND AMPLIFIERS AND WHICH PERFORMS DIRECT CURRENT OFFSET CORRECTION OF THE FIRST AND SECOND AMPLIFIERS

(75) Inventors: Fumi Moritsuka, Tokyo (JP); Shoji Otaka, Yokohama (JP); Masahiro Hosoya, Kawasaki (JP); Hiroaki Ishihara, Kawasaki (JP); Tsuyoshi Kogawa, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 130 days.

(21) Appl. No.: 13/052,371

(22) Filed: Mar. 21, 2011

(65) Prior Publication Data
US 2012/0034875 A1   Feb. 9, 2012

(30) Foreign Application Priority Data

Aug. 6, 2010   (JP) .............................. P2010-177462

(51) Int. Cl.
*H04B 1/00*   (2006.01)

(52) U.S. Cl.
USPC ....... 455/63.1; 455/296; 455/130; 455/253.2; 455/341; 455/127.1; 455/127.2; 455/127.3; 341/142; 341/118; 330/129; 330/69; 330/253; 330/127

(58) Field of Classification Search
USPC ............... 455/63.1, 127.1, 127.2, 127.3, 296, 455/253.2, 341; 341/142, 118; 330/129, 69, 330/253, 127
See application file for complete search history.

(56) References Cited

U.S. PATENT DOCUMENTS

| | | |
|---|---|---|
| 5,724,653 A | 3/1998 | Baker et al. |
| 6,356,218 B1 * | 3/2002 | Brown et al. .................. 341/120 |

(Continued)

FOREIGN PATENT DOCUMENTS

| | | |
|---|---|---|
| JP | H08-242262 A | 9/1996 |
| JP | 11-284678 A | 10/1999 |

(Continued)

OTHER PUBLICATIONS

Japanese Office Action dated Jul. 3, 2012 (and English translation thereof) in counterpart Japanese Application No. 2010-177462.

(Continued)

*Primary Examiner* — Temesgh Ghebretinsae
*Assistant Examiner* — Md Talukder
(74) *Attorney, Agent, or Firm* — Holtz, Holtz, Goodman & Chick, PC (57) ABSTRACT

A radio apparatus capable of correcting a direct current offset with high accuracy in a short time is provided. A radio apparatus according to an embodiment includes a first amplifier amplifying a signal inputted to an input terminal with amplification gain determined by a variable resistor to generate a first amplified signal, and a second amplifier amplifying the first amplified signal to generate a second amplified signal. Further, the radio apparatus includes a first correcting unit correcting a direct current offset of the first amplifier, and a second correcting unit correcting a direct current offset of the second amplifier. The radio apparatus also includes a reference voltage source or reference current source supplying a reference voltage or reference current for referring a direct current offset to the first amplifier and the second amplifier, a gain controller controlling the amplification gain of the first amplifier; and a correction controller controlling the gain controller to set the amplification gain to maximum and controlling the first and second correcting units to perform correction of the second correcting unit based on the second amplified signal obtained by inputting the reference voltage or the reference current to an input terminal of the second amplifier, and thereafter perform correction of the first correcting unit based on the second amplified signal obtained by inputting the reference voltage or the reference current to an input terminal of the first amplifier.

15 Claims, 7 Drawing Sheets

U.S. PATENT DOCUMENTS

| | | |
|---|---|---|
| 7,420,410 B2 | 9/2008 | Ohba |
| 7,907,589 B2 | 3/2011 | Shimizu et al. |
| 2002/0025792 A1* | 2/2002 | Isoda .................. 455/234.1 |
| 2003/0214423 A1* | 11/2003 | Lee et al. ................ 341/118 |
| 2004/0198257 A1* | 10/2004 | Takano et al. ............ 455/108 |
| 2005/0062855 A1* | 3/2005 | Tani et al. ................ 348/222.1 |
| 2006/0189285 A1* | 8/2006 | Takano et al. ............ 455/127.2 |
| 2006/0217069 A1* | 9/2006 | Chen et al. ............... 455/63.1 |
| 2006/0229043 A1* | 10/2006 | Kurimoto .................. 455/234.1 |
| 2006/0252392 A1* | 11/2006 | Beamish et al. ............ 455/126 |
| 2007/0093225 A1* | 4/2007 | Murakami et al. ........ 455/252.1 |
| 2007/0111688 A1* | 5/2007 | Ueno et al. ............... 455/130 |
| 2007/0202813 A1* | 8/2007 | Ono et al. ................ 455/78 |
| 2007/0202814 A1* | 8/2007 | Ono et al. ................ 455/78 |
| 2007/0293180 A1* | 12/2007 | Rahman et al. ............ 455/296 |
| 2009/0185639 A1* | 7/2009 | Han et al. ................ 375/319 |
| 2009/0212983 A1* | 8/2009 | Fukuzawa et al. ............ 341/142 |
| 2009/0258626 A1* | 10/2009 | Yamada et al. ............ 455/253.2 |
| 2010/0015937 A1* | 1/2010 | Yang et al. ................ 455/253.2 |
| 2011/0195673 A1* | 8/2011 | Pratt et al. ................ 455/78 |
| 2011/0215857 A1* | 9/2011 | Nonin ...................... 327/307 |
| 2011/0248688 A1* | 10/2011 | Iacob et al. ................ 323/234 |
| 2012/0034875 A1* | 2/2012 | Moritsuka et al. ............ 455/63.1 |

FOREIGN PATENT DOCUMENTS

| | | |
|---|---|---|
| JP | 2002-094346 A | 3/2002 |
| JP | 2005-072895 A | 3/2005 |
| JP | 2006-352401 A | 12/2006 |
| JP | 2009-200829 A | 9/2009 |
| JP | 4403132 B2 | 11/2009 |
| WO | WO 2005/055447 A1 | 6/2005 |

OTHER PUBLICATIONS

Japanese Office Action dated Dec. 18, 2012 (and English translation thereof) in counterpart Japanese Application No. 2010-177462.

* cited by examiner

RADIO APPARATUS HAVING FIRST AND SECOND AMPLIFIERS AND WHICH PERFORMS DIRECT CURRENT OFFSET CORRECTION OF THE FIRST AND SECOND AMPLIFIERS

CROSS-REFERENCE TO RELATED APPLICATION

This application is based upon and claims the benefit of priority from the prior Japanese Patent Application No. 2010-177462, filed on Aug. 6, 2010; the entire contents of which are incorporated herein by reference.

FIELD

Embodiments described herein relate generally to a radio apparatus capable of correcting a direct current offset in a short time.

BACKGROUND

In a radio apparatus such as a receiver, a direct current offset component generated due to characteristics variability in elements forming an analog circuit or the like causes deterioration in reception characteristics. Particularly, when a variable gain amplifier or the like is provided in the radio apparatus, the level of the direct current offset component generated from the amplifier varies depending on gain. Thus, offset correction of each gain is necessary, and it has been difficult to correct a direct current offset with high accuracy by processing in a short time.

DETAILED DESCRIPTION

A radio apparatus according to an embodiment includes a first amplifier amplifying a signal inputted to an input terminal with amplification gain determined by a variable resistor to generate a first amplified signal, and a second amplifier amplifying the first amplified signal to generate a second amplified signal. Further, the radio apparatus includes a first correcting unit correcting a direct current offset of the first amplifier, and a second correcting unit correcting a direct current offset of the second amplifier. The radio apparatus also includes a reference voltage source or reference current source supplying a reference voltage or reference current for referring a direct current offset to the first amplifier and the second amplifier, a gain controller controlling the amplification gain of the first amplifier; and a correction controller controlling the gain controller to set the amplification gain to maximum and controlling the first and second correcting units to perform correction of the second correcting unit based on the second amplified signal obtained by inputting the reference voltage or the reference current to an input terminal of the second amplifier, and thereafter perform correction of the first correcting unit based on the second amplified signal obtained by inputting the reference voltage or the reference current to an input terminal of the first amplifier.

Hereinafter, embodiments will be described in detail with reference to the drawings.

First Embodiment

Figure 1:
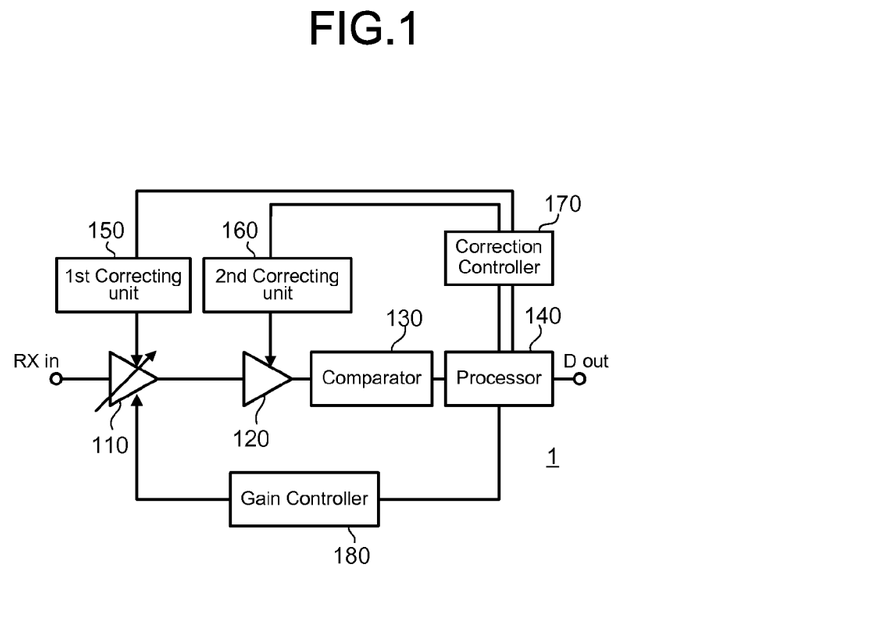
FIG. 1 is a block diagram illustrating a structure of a radio apparatus according to a first embodiment.

As illustrated in FIG. 1, a radio apparatus 1 according to a first embodiment includes a first amplifier 110, a second amplifier 120 amplifying an output signal of the first amplifier 110, a comparator 130 comparing an output signal of the second amplifier 120 with a predetermined threshold, and a processor 140 generating a digital signal based on a comparison result from the comparator 130. Further, this radio apparatus 1 includes a first correcting unit 150 and a second correcting unit 160 giving direct current offset correction values (corrected voltages or corrected currents) to the first amplifier 110 and the second amplifier 120, respectively, a correction controller 170 executing processing of correcting direct current offsets of the first amplifier 110 and the second amplifier 120, and a gain controller 180 controlling gain of the first amplifier 110.

An output terminal of the first amplifier 110 is connected to an input terminal of the second amplifier 120, and each amplifier amplifies a received signal. The received signal may be a high-frequency signal or a baseband signal. In the embodiment described below, an envelope detected signal is used as the received signal. The first amplifier 110 amplifies the received signal and generates a first amplified signal, and the second amplifier 120 further amplifies the first amplified signal obtained in the first amplifier 110 by amplifying the received signal and generates a second amplified signal. In the first amplifier 110, amplification gain can be controlled so as to respond to excessive received signal input or the like. An output terminal of the second amplifier 120 is connected to an input terminal of the comparator 130. The first amplifier 110 amplifies a signal with variable amplification gain determined by a variable resistor element, or the like. Here, the term "amplification gain" is used as an amplification factor with broad meaning that is obtained by a ratio between an output signal and an input signal.

The comparator 130 compares a value (for example, a voltage value) appearing at the output terminal of the second amplifier 120 with a predetermined threshold. The comparator 130 outputs, for example, an H signal (High signal) when the value appearing at the output terminal of the second amplifier 120 surpasses the threshold as a result of comparison, or outputs, for example, an L signal (Low signal) when the value is equal to or lower than the threshold. That is, the received signal is converted into a binary signal of H or L. An output terminal of the comparator 130 is connected to an input terminal of the processor 140.

The processor 140 processes the binary signal converted by the comparator 130 and outputs a digital signal. The processor 140 decodes the received signal based on the binary signal outputted by the comparator 130. Further, the processor 140 has a function to detect whether the first amplifier 110 is saturated or not by excessive received signal input or the like, and give a detection result to the gain controller 180. Moreover, the processor 140 also has a function to calculate the direct current offset correction values for the first amplifier 110 and the second amplifier 120. An output terminal of the processor 140 is connected to a decoded signal output terminal Dout, the correction controller 170, and the gain controller 180.

The first correcting unit 150 and the second correcting unit 160 generate the direct current offset correction values for the first amplifier 110 and the second amplifier 120, and give them to the first amplifier 110 and the second amplifier 120, respectively. The first correcting unit 150 and the second correcting unit 160 generate the respective correction values for the first amplifier 110 and the second amplifier 120 based on a correction instruction from the correction controller 170. The correction controller 170 executes direct current offset correction processing for the first amplifier 110 and the second amplifier 120 at predetermined timing. Output terminals of the correction controller 170 are connected to the first correcting unit 150 and the second correcting unit 160. The gain controller 180 has a function to control the gain of the first amplifier 110 in direct current offset processing for the first amplifier 110 and the second amplifier 120 by the correction controller 170, in addition to an AGC (Automatic Gain Control) function to suppress saturation of the first amplifier 110 due to excessive reception input.

Figure 2:
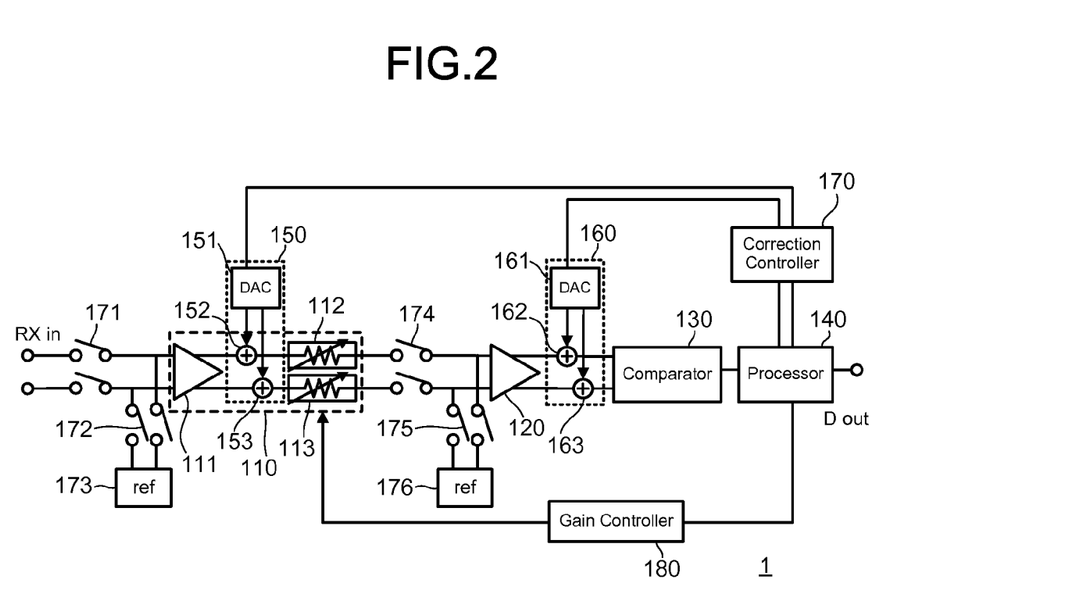
FIG. 2 is a block diagram illustrating a specific example of the structure of the radio apparatus according to the first embodiment.

Next, with reference to FIG. 2, the structure of the radio apparatus 1 of this embodiment will be described in more detail. As illustrated in FIG. 2, the first amplifier 110 includes an amplifying element 111 having a positive and a negative input terminal and a positive and a negative output terminal, and variable attenuators 112 and 113 having input terminals connected to the output terminals of the amplifying element 111, respectively. Attenuation amounts of the variable attenuators 112 and 113 are controlled by the gain controller 180.

The first correcting unit 150 includes a digital/analog converter (DAC) 151 converting a digital correction value given from the correction controller 170 into an analog correction value, and adders 152 and 153 adding the analog correction value converted by the DAC 151 to output signals of the amplifying element 111. The second correcting unit 160 includes a DAC 161 and adders 162 and 163, similarly to the first correcting unit 150.

Further, the radio apparatus 1 of this embodiment includes switches SW171 capable of disconnecting input terminals of the first amplifier 110 and received signal input terminals RXin, and switches SW172 capable of connecting the input terminals of the first amplifier 110 and output terminals of a reference voltage source 173. Likewise, the radio apparatus 1 according to this embodiment includes switches SW174 capable of disconnecting input terminals of the second amplifier 120 and output terminals of the first amplifier 110, and switches SW175 capable of connecting the input terminals of the second amplifier 120 and output terminals of a reference voltage source 176.

Operation of the First Embodiment

Figure 3:
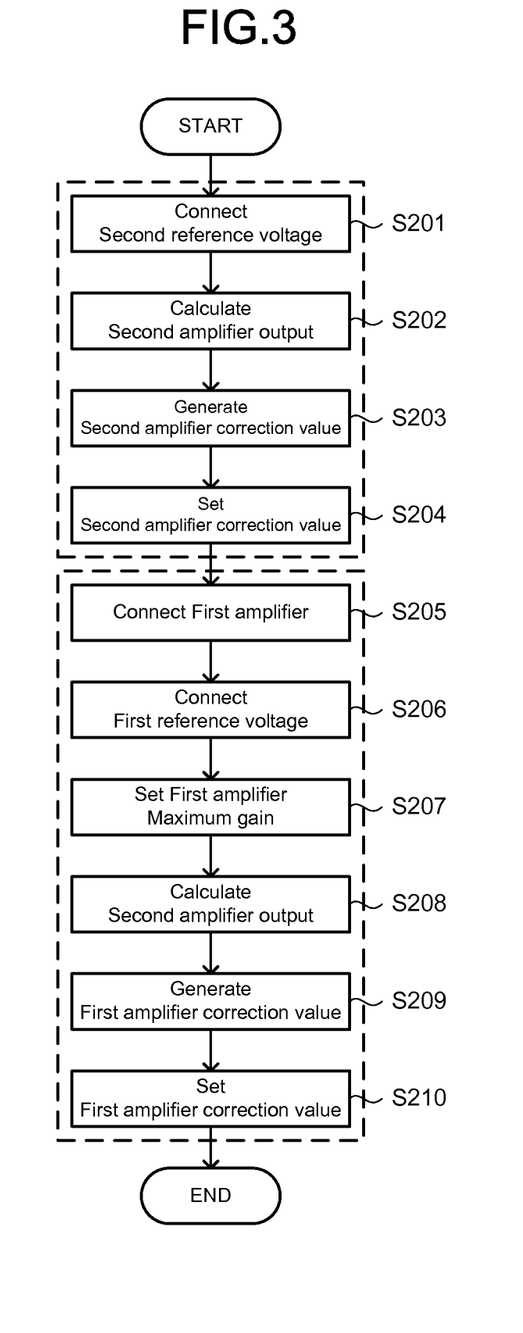
FIG. 3 is a flowchart illustrating operation of the radio apparatus according to the first embodiment.

Next, operation of this embodiment will be described with reference to FIG. 1 to FIG. 3.

Based on a predetermined timing or an instruction signal coming from outside, the correction controller 170 turns off SW174 and turns on SW175, thereby connecting the output terminals of the reference voltage source 176 to the input terminals of the second amplifier 120 (step 201, hereinafter referred to as "S201" and so on). When initial correction values of the first correcting unit 150 and the second correcting unit 160 are set to zero, a direct current offset component generated in the second amplifier 120 appears as a consequence at the output terminals of the second amplifier 120.

When the output terminals of the reference voltage source 176 are connected to the input terminals of the second amplifier 120, the comparator 130 compares an output signal of the second amplifier 120 resulting from amplifying a second reference voltage with a predetermined threshold. It is desired that this threshold of the comparator 130 in the direct current offset correction processing be set to substantially zero. This is because by setting the threshold to substantially zero, the output signal of the comparator 130 as it is becomes a direct current offset component. The processor 140 calculates a comparison result from the comparator 130 (S202), and generates the direct current offset correction value (S203).

The correction controller 170 sends the correction value generated by the processor 140 to the second correcting unit 160, and the second correcting unit 160 converts the sent correction value into an analog value and gives the converted value as a correction voltage to the second amplifier 120 (S204). By processing up to this point, correction of the second amplifier 120 is completed.

Subsequently, the correction controller 170 turns off SW175, turns on SW174, turns off SW171, and turns on SW172. That is, the output terminals of the reference voltage source 176 are disconnected from the input terminals of the second amplifier 120, and the output terminals of the first amplifier 110 and the input terminals of the second amplifier 120 are connected (S205). The input terminals of the first amplifier 110 and the received signal input terminals RXin are disconnected, and the output terminals of the reference voltage source 173 are connected to the input terminals of the first amplifier 110 (S206). In this state, the correction value of the first correcting unit 150 is set to zero while the correction value of the second correcting unit 160 remains to be the value set in step 204.

Then, the correction controller 170 instructs the gain controller 180 to maximize the amplification gain of the first amplifier 110, and the gain controller 180 sets the attenuation amounts of the variable attenuators 112 and 113 to minimum (S207). The closer the attenuation amount of the variable attenuator 112 is to minimum, the higher the accuracy of offset correction will be, but this attenuation amount is not limited to 0% (maximum gain). For example, the attenuation amount may be about 50%.

When the output terminals of the reference voltage source 173 are connected to the input terminals of the first amplifier 110, the comparator 130 compares the output signal of the second amplifier 120 obtained by further amplifying the output signal of the first amplifier 110, which is obtained by amplifying a first reference voltage, with a predetermined threshold. At this time, the direct current offset correction of the second amplifier 120 is already completed, and thus the direct current offset component of the first amplifier 110 appears with high accuracy in the output signal of the second amplifier 120.

The processor 140 calculates a comparison result from the comparator 130 (S208), and generates the direct current offset correction value (S209). It is also desired that the threshold of the comparator 130 in the direct current offset correction processing be set to substantially zero, as described above.

The correction controller 170 sends the correction value generated by the processor 140 to the first correcting unit 150, and the first correcting unit 150 converts the sent correction value into an analog value and gives the converted value as a correction voltage to the first amplifier 110 (S210). By processing up to this point, correction of the first amplifier 110 is completed.

When the correction of the first amplifier 110 and the second amplifier 120 is completed, the correction controller 170 turns off SW172 and turns on SW171. That is, the output terminals of the reference voltage source 173 are disconnected from the input terminals of the first amplifier 110, and the received signal input terminals and the input terminals of the first amplifier 110 are connected.

In the radio apparatus of this embodiment, after the direct current offset correction of the second amplifier 120 is performed, which is an amplifier in a rear stage, the direct current offset correction of the first amplifier 110 is performed, which is an amplifier in a front stage. Thus, the direct current offset component of the amplifier in the front stage can be amplified accurately by the amplifier in the rear stage which is already corrected. That is, the direct current offset correction of the amplifier in the front stage can be performed accurately.

Further, in the radio apparatus of this embodiment, the direct current offset correction is performed with the amplifier capable of varying amplification gain (the amplifier in the front stage) being set to the maximum gain. Thus, even when a residual offset component exists after correction, this residual offset component will be compressed when the amplifier in the front stage operates normally (with at least the amplification gain smaller than the maximum gain). That is, the influence of the direct current offset can be reduced further, and deterioration in reception characteristics can be suppressed. Further, by the residual offset component being compressed more than at the time of maximum gain, the residual offset component would not become larger even when the amplification gain of this amplifier is changed, and thus it is no longer necessary to perform the direct current offset correction for each amplification gain. This makes it possible to reduce the time needed for the direct current offset correction processing, and further possible to reduce the circuit scale. By performing the direct current offset correction at the time of activation or at every certain time, the direct current offset can be kept small as the time passes on.

In the above-described embodiment, although the correction voltage is generated using the reference voltage source in correction of the direct current offset, note that it is not restrictive. Specifically, depending on whether the amplifier is for voltage amplification or current amplification, or the like, a reference voltage or reference current can be generated using a reference voltage source or reference current source, to thereby correct the direct current offset. The same applies to the embodiments described below.

Correction Value Calculation Operation Example 1

Figure 4:
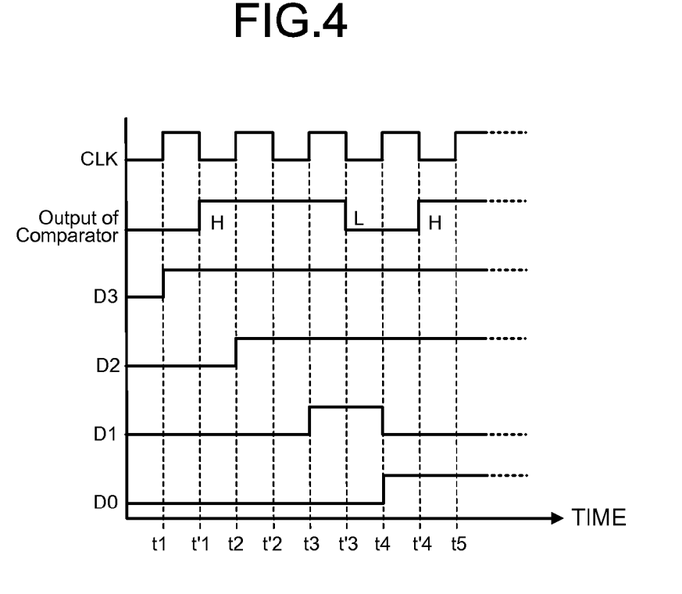
FIG. 4 is a timing chart illustrating operation of a processor of the radio apparatus according to the first embodiment.
Figure 5:
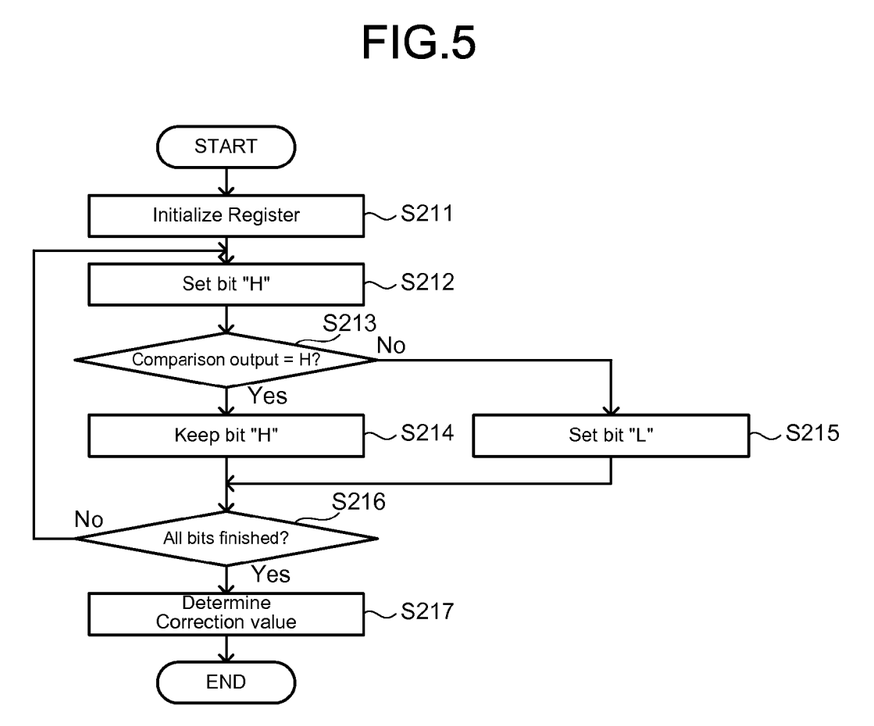
FIG. 5 is a flowchart illustrating operation of the processor of the radio apparatus according to the first embodiment.

Here, with reference to FIG. 3 to FIG. 5, the offset correction operation by the comparator 130, the processor 140, and the correction controller 170 of this embodiment will be described in detail. The processor 140 and the correction controller 170 of this embodiment calculate the respective correction values for the first correcting unit 150 and the second correcting unit 160 with each other. Here, by way of example, the correction value calculation processing in step 203 of FIG. 3 will be described in detail.

When the output terminals of the reference voltage source 176 are connected to the input terminals of the second amplifier 120, the processor 140 initializes an internal register (with four bits: D0 to D3, as an example), as illustrated in FIG. 5 (S211). As a result, bit values D0 and D1 in the internal register both become L ("0").

First, when the time of an internal clock of the comparator 130 (and the processor 140) is t1 (rising of the clock), the processor 140 sets the most significant bit D3 to "1" ("H") (S212).

Subsequently, when the time of the internal clock is at t'1 (falling of the clock), the processor 140 determines whether the output signal of the comparator 130 is "H" or not (S213). When the output signal of the comparator 130 is "H" (Yes in S213), the processor 140 keeps the most significant bit D3 to "1" as it is at time t2 of the internal clock (S214).

On the other hand, when the output signal of the comparator 130 is "L" (No in S213), the processor 140 resets the bit D3 to "0" at time t2 of the internal clock and retains this (S215).

When processing of all the bit values in the internal register is not finished at this point (No in S216), the processor 140 sets the next bit D2 to "1" at time t2 of the internal clock (S212).

Subsequently, at time t'2 of the internal clock, the processor 140 determines whether the output signal of the comparator 130 is "H" or not (S213). When the output signal of the comparator 130 is "H" (Yes in S213), the processor 140 retains the bit D2 to be "1" as it is at time t3 of the internal clock (S214).

On the other hand, when the output signal of the comparator 130 is "L" (No in S213), the processor 140 resets the bit D2 to "0" at time t3 of the internal clock and retains this (S215).

When processing of all the bits of the internal register is finished (Yes in S216), that is, when processing down to the least significant bit D0 is finished, the correction controller 170 sends the bit values D0 to D3 of the internal register of the processor 140 to the DAC 161 as a code outputting a correction voltage value or correction current value. The DAC 161 converts the sent bit values into an analog correction voltage value or correction current value, and gives this value to the adders 162 and 163. That is, the direct current offset correction of the second amplifier 120 is finished (S217). Thereafter, similar processing is performed in step S209 of FIG. 3, thereby completing the direct current offset correction of the first amplifier 110 and the second amplifier 120.

In this example, a successive comparison method is used for calculating the correction values. Accordingly, digital calculation in the processor 140 can be achieved in a short time by simple processing. Further, a highly accurate A/D converter is not necessary, and processing with a one-bit comparator is possible. In other words, the circuit scale can be suppressed, and direct current offset processing with low power consumption can be achieved.

Correction Value Calculation Operation Example 2

Figure 6:
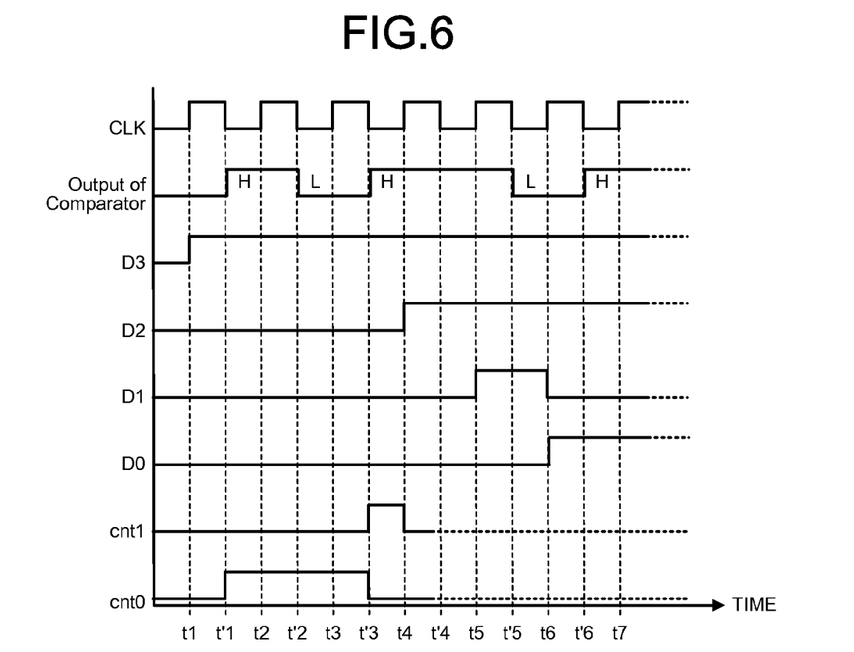
FIG. 6 is a timing chart illustrating another operation example of the processor of the radio apparatus according to the first embodiment.

Next, another example of operation of the comparator 130 and the processor 140 of this embodiment will be described in detail with reference to FIG. 3, FIG. 6, and FIG. 7.

Figure 7:
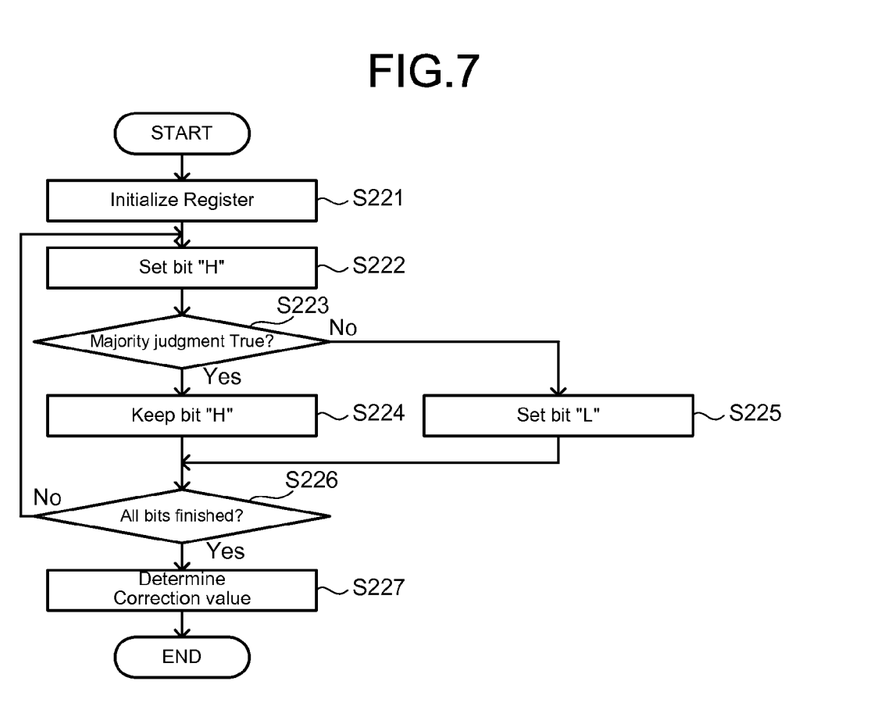
FIG. 7 is a flowchart illustrating another operation example of the processor of the radio apparatus according to the first embodiment.

As illustrated in FIG. 7, when the output terminals of the reference voltage source 176 are connected to the input terminals of the second amplifier 120, the processor 140 initializes an internal register (for example, with four bits of correction values: D0 to D3 and two bits of majority judgment: cnt0, cnt1, six bits in total) (S221). As a result, the bit values D0 to D3, cnt0, and cnt1 of the internal register all become L ("0").

First, when the time of an internal clock of the comparator 130 (and the processor 140) is at t1 (rising of the clock), the processor 140 sets the most significant bit D3 to "1" ("H") (S222).

Subsequently, the processor 140 determines whether or not an output signal "H" of the comparator 130 appears a predetermined number of times or more in a certain time (for example, more than a half of all output results of the comparator 130) (S223). For example, assuming that the number of times of majority judgment is three times, each time when the time of the internal clock is t'1, t'2, and t'3, the processor 140 adds "1" to the cnt of the internal register if the output signal of the comparator 130 is "H", or otherwise does not add "1" to the cnt of the internal register if the output signal is "L".

When the decimal number of the cnt becomes 2 or more as a result of comparison for the predetermined number of times, that is, when more than half of the output signals of the comparator 130 is "H" (Yes in S223), the processor 140 maintains "H" of the bit D3 at time t4 of the internal clock (S224).

When the decimal number of the cnt is less than 2 as a result of comparison for the predetermined number of times, that is, when more than half of the output signals of the comparator 130 is not "H" (No in S223), the processor 140 resets the bit D3 to "L" at time t4 of the internal clock (S225).

When one time of majority judgment is finished, the processor 140 initializes the value of the cnt to zero at subsequent time (time t4 of the internal clock).

When processing of all the bit values of the internal register is not finished at this time point (No in S226), the processor 140 sets the next bit D2 to "1" at time t4 of the internal clock (S222). Thereafter, step 222 to step 226 are repeated until processing of all the bits is finished.

When processing of all the bits of the internal register is finished (Yes in S226), that is, when processing down to the least significant bit D0 is finished, the correction controller 170 sends the bit values D0 to D3 of the internal register of the processor 140 to the DAC 161 as a code outputting a correction voltage value or correction current value. The DAC 161 converts the sent bit values into an analog correction voltage value or correction current value, and gives this value to the adders 162 and 163. That is, the direct current offset correction of the second amplifier 120 is finished (S227). Thereafter, similar processing is performed in step S209 of FIG. 3, thereby completing the direct current offset correction of the first amplifier 110 and the second amplifier 120.

Here, the number of times of performing the majority judgment is three, but the number of times of the majority judgment may be any number as long as it is one or more times. For the case where the number of times is even and the determination result becomes the same number, it may be determined in advance either "1" or "0" is inputted to the bits. Further, only the most significant bit is judged by majority, but the majority judgment may be made on all the bits or a certain bit. Further, regarding counting processing, the method which counts the number of times the output signal of the comparator is "H" has been described, but a method which counts "L" may be employed.

According to the operation of this embodiment, even when influence of noise appears in the output signal of the comparator 130, erroneous determination can be reduced by the majority judgment processing, and highly accurate direct current offset removal can be achieved.

Other Structural Examples of the First Amplifier and the First Correcting Unit

Here, other structural examples of the first amplifier and first correcting unit in this embodiment will be described with reference to FIG. 8.

Figure 8:
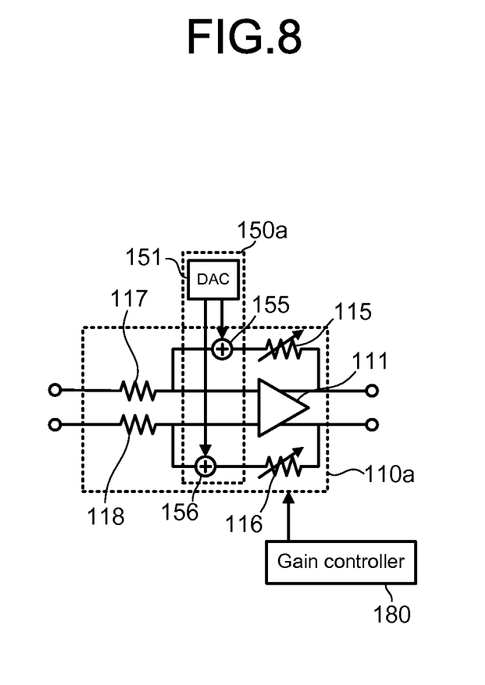
FIG. 8 is a block diagram illustrating another specific example of a first amplifier according to the first embodiment.

As illustrated in FIG. 8, the first amplifier 110a of this example includes an amplifying element 111, resistors 117 and 118 interposed between received signal input terminals and input terminals of the amplifying element 111, and variable resistors 115 and 116 connecting a positive and a negative output terminal of the amplifying element 111 and a positive and a negative input terminal of the amplifying element 111, respectively. The resistors 117 and 118 function as input resistors of the amplifying element 111. The variable resistors 115 and 116 feed back outputs of the amplifying element 111 to inputs thereof. Amplification gain of the amplifying element 111 is determined by the resistance ratio between the resistor 117 and the variable resistor 115, and the resistance ratio between the resistor 118 and the variable resistor 116. That is, in the first amplifier 110a of this example, the variable resistors 115 and 116 which are feedback resistors function as variable attenuators illustrated in FIG. 2, and are controlled by the gain controller 180.

Further, a first correcting unit 150a of this example includes a DAC 151 and adders 155 and 156 connected to ones among respective terminals of the variable resistors 115 and 116 located on the side of the input terminals of the amplifying element 111. The adders 155 and 156 add two output signals of the DAC 151 and output signals of the variable resistors 115 and 116 (signals of the variable resistors 115 and 116 on the side of the input terminals of the amplifying element 111) and give the results to the input terminals of the amplifying element 111. That is, in this example, direct current offset correction values outputted from the DAC 151 are added to the output signals of the feedback resistors.

With the first amplifier and the first correcting unit of this structural example, since the amplification gain is controlled by resistance values of the feedback resistors, the amplification operation can be stabilized.

Second Embodiment

Next, a radio apparatus of a second embodiment will be described with reference to FIG. 9. The second embodiment is made by changing the number of amplification stages of the first embodiment to three. In the following description, the same components as those in the first embodiment are denoted by common numerals, and duplicating descriptions are omitted.

Figure 9:
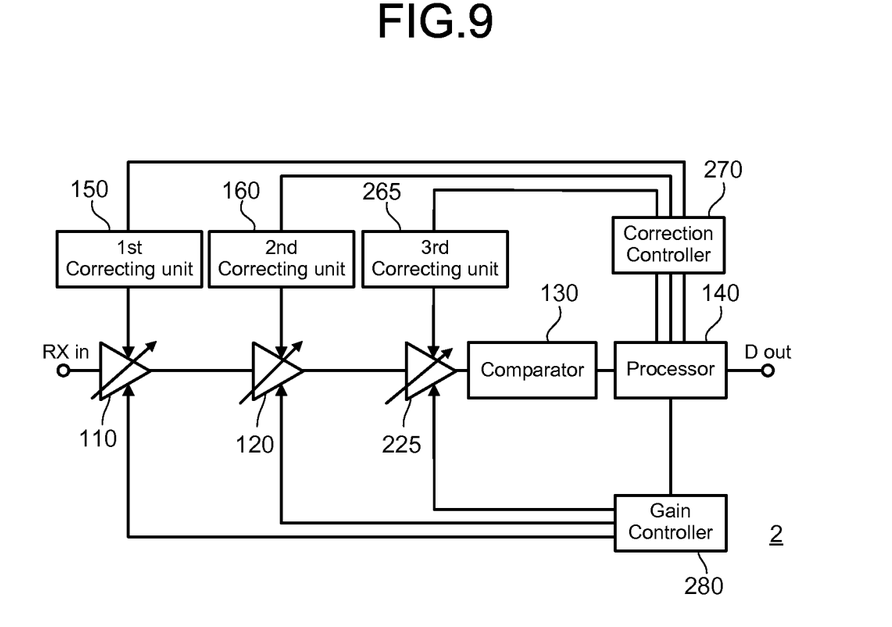
FIG. 9 is a block diagram illustrating a structure of a radio apparatus according to a second embodiment.

As illustrated in FIG. 9, a radio apparatus 2 according to the second embodiment includes a third amplifier 225 further amplifying the output signal of the second amplifier 120, a third correcting unit 265 giving a direct current offset correction value to the third amplifier 225, a correction controller 270 performing correction processing of respective direct current offsets of the first to third amplifiers 110, 120, 225, and a gain controller 280 controlling gain of the first to third amplifiers 110, 120, 225, in addition to the radio apparatus 1 of the first embodiment.

The third correcting unit 265, the correction controller 270, and the gain controller 280 have functions common to the first and second correcting units 150, 160, the correction controller 170, and the gain controller 180 according to the first embodiment.

Operation of the second embodiment is similar to the operation of the first embodiment. Specifically, the correction controller 270 first performs the direct current offset correction processing for the third amplifier 225 to decide a direct current offset correction value for the third correcting unit 265, then performs the direct current offset correction processing for the second amplifier 120 to decide a direct current offset correction value for the second correcting unit 160, and further performs the direct current offset correction processing for the first amplifier 110 to decide a direct current offset correction value for the first correcting unit 150. The direct current offset correction processing in each of the stages is performed in a state that gain of the first to third amplifiers 110, 120, 225 is maximum.

Also in the radio apparatus according to the second embodiment, effects similar to those of the radio apparatus of the first embodiment can be achieved.

Third Embodiment

Next, a radio apparatus of the third embodiment will be described with reference to FIG. 10. In the following description, the same components as those in the first embodiment are denoted by common numerals, and duplicating descriptions are omitted.

Figure 10:
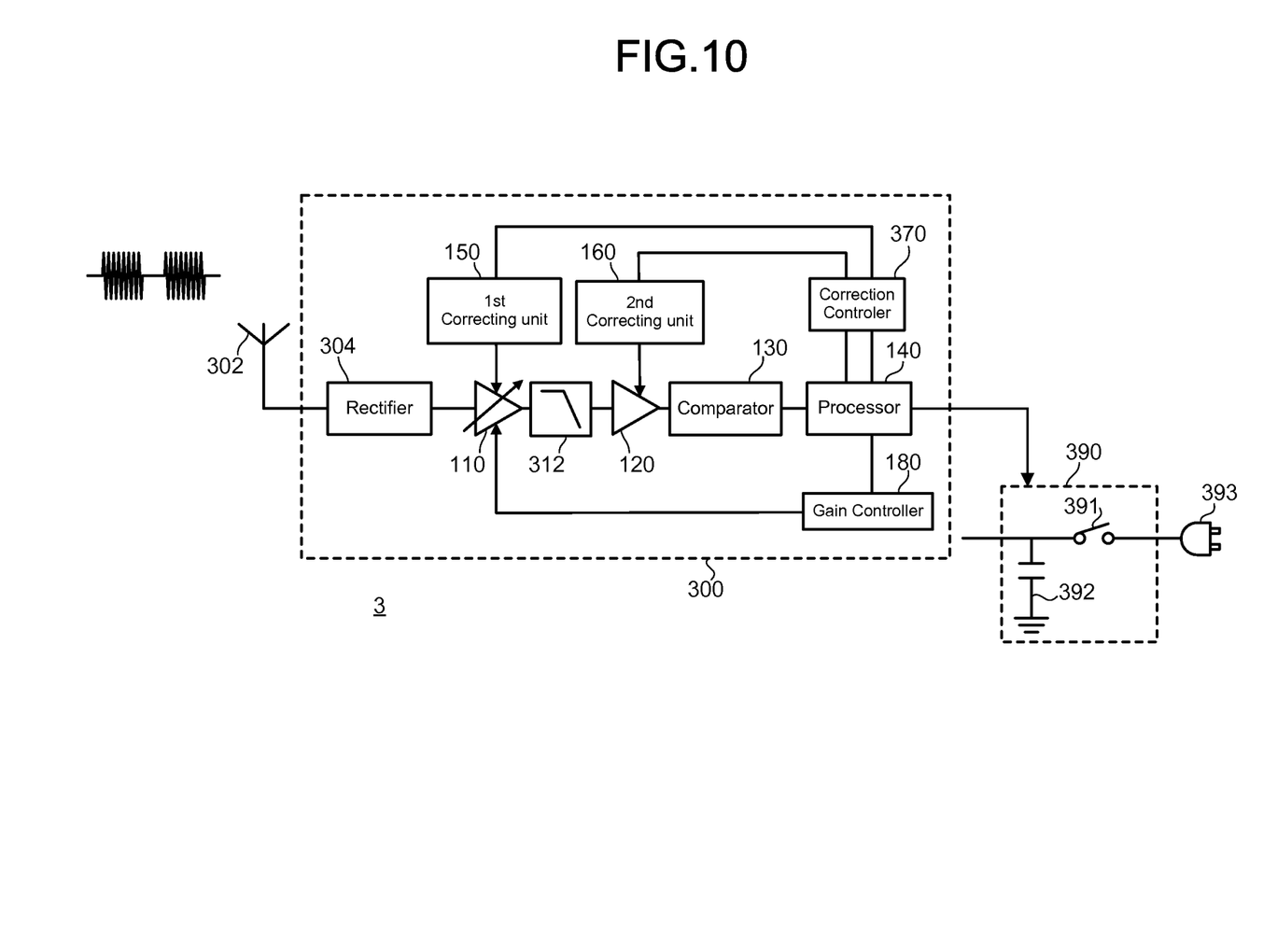
FIG. 10 is a block diagram illustrating a structure of a radio apparatus according to a third embodiment.

As illustrated in FIG. 10, a radio apparatus 3 of this embodiment includes an antenna 302, a rectifier 304, a first amplifier 110, a low-pass filter (LPF) 312, a second amplifier 120, a comparator 130, a processor 140, a first correcting unit 150, a second correcting unit 160, a correction controller 370, a gain controller 180, and a power supply controller 390. Among them, the first amplifier 110, the second amplifier 120, the comparator 130, the processor 140, the first correcting unit 150, the second correcting unit 160, and the gain controller 180 are components common to the first embodiment.

The antenna 302 receives a radio wave transmitted from a not-illustrated remote controller or the like. In this embodiment, the antenna receives a signal modulated by, for example, on-off keying (OOK) or frequency shift keying (FSK). An output terminal of the antenna 302 is connected to an input terminal of the rectifier 304. The rectifier 304 is a wave detector which performs envelope detection of a high frequency signal received by the antenna 302. The rectifier 304 is achieved by, for example, a semiconductor element such as a diode. An output terminal of the rectifier 304 is connected to an input terminal of the first amplifier 110. The LPF 312 is connected between an output terminal of the first amplifier 110 and an input terminal of the second amplifier 120, and removes any unnecessary frequency component contained in an amplified output of the first amplifier 110. The correction controller 370 corresponds to the correction controller 170 of the first embodiment, and executes the direct current offset correction processing. The power supply controller 390 is a power supply device of this radio apparatus 3. The power supply controller 390 includes a power supply switch 391 supplying power to respective parts of this radio apparatus, and turns on and off the power supply switch 391 based on an instruction from the processor 140. The power supply controller 390 includes a power storage unit 392, allowing operation of receiving a radio wave even when the power supply switch 391 is off.

A signal received by the antenna 302 is sent to the rectifier 304. The rectifier 304 performs envelope detection of the received signal and sends a base band received signal to the first amplifier 110.

The first amplifier 110 amplifies the sent received signal to a desired level, and sends the amplified signal to the LPF 312. The LPF 312 removes high frequency noise contained in the received signal and sends the filtered received signal to the second amplifier 120. The second amplifier 120 further amplifies the filtered received signal, and sends the amplified signal to the comparator 130.

The comparator 130 compares the amplified signal with a threshold voltage and outputs an output signal at H level or L level, and the processor 140 calculates (decodes) the output signal of the comparator 130 as a digital signal. When a signal instructing turning on of the power supply is contained in the received signal as a result of the calculation, the power supply controller 390 turns on the power supply switch 391 to supply power to the respective parts of the radio apparatus 3, and starts charging of the power storage unit 392 at the same time.

Operation of the Third Embodiment

Figure 11:
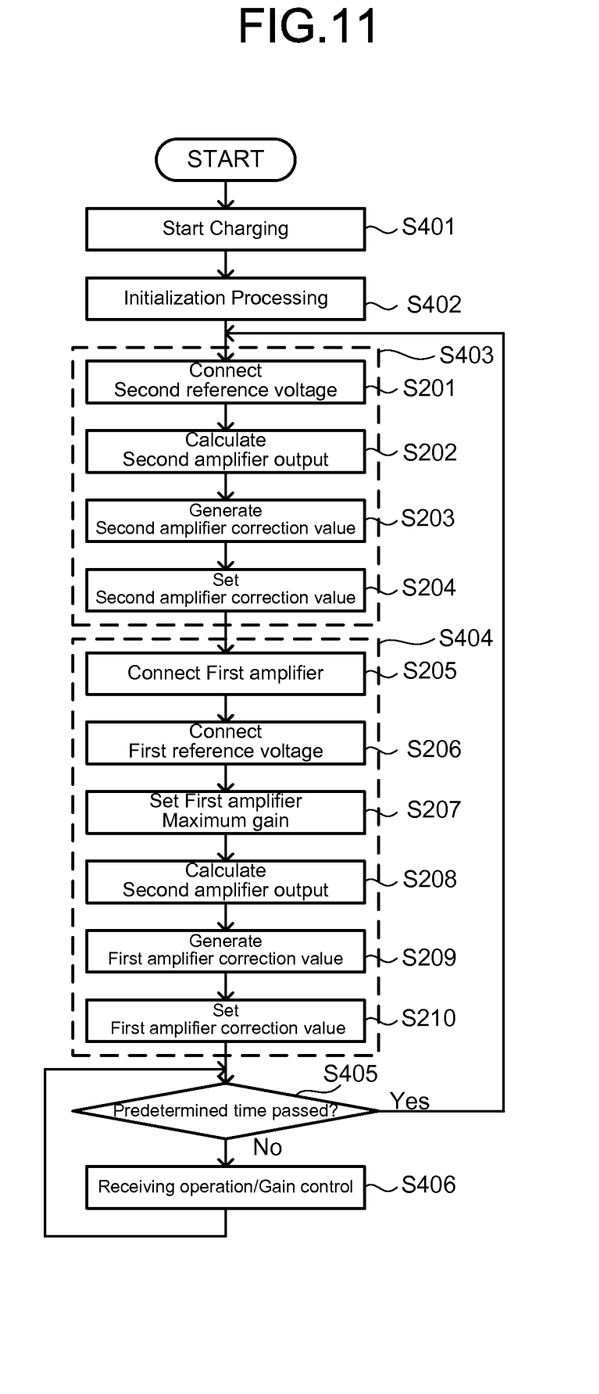
FIG. 11 is a flowchart illustrating operation of the radio apparatus according to the third embodiment.

Next, operation of the direct current offset correction processing in the radio apparatus of this embodiment will be described with reference to FIG. 11. This operation is an application of the direct current offset correction processing in the first embodiment. In the description below, steps common to the operation of the first embodiment are denoted by common numerals, and duplicating descriptions are omitted.

When the user turns on the power supply switch 391, the power supply controller 390 starts supplying power to the respective parts, and starts charging of the power storage unit 392 (S401). When the charging is started, the correction controller 370 and the power supply controller 390 initialize resistors and so on (S402).

When the resistors and so on are initialized, the correction controller 370 executes the direct current offset correction processing for the second amplifier 120 (S403). The direct current offset correction processing for the second amplifier 120 is common to the processing from step 201 to step 204 of the direct current offset correction processing in the first embodiment illustrated in FIG. 3.

When the direct current offset correction processing for the second amplifier 120 is finished, the correction controller 370 executes the direct current offset correction processing for the first amplifier 110 (S404). The direct current offset correction processing for the first amplifier 110 is common to the processing from step 205 to step 210 of the direct current offset correction processing in the first embodiment illustrated in FIG. 3.

When the direct current offset correction processing for the second amplifier 120 and the direct current offset correction processing for the first amplifier 110 are completed, the correction controller 370 turns to a standby state until next correction processing (S405). The correction controller 370 has a timer in itself, and maintains the standby state for a predetermined time. While the correction controller 370 is in the standby state (No in S405), the processor 140 performs calculation (decoding) of the received signal, and the gain controller 180 controls amplification gain of the first amplifier 110 according to the received signal strength, or the like (S406).

When the timer of the correction controller 370 detects that the standby time has passed (Yes in S405), the correction controller 370 performs the direct current offset correction processing for the second amplifier 120 (S403) and the direct current offset correction processing for the first amplifier 110 (S404).

Note that the standby time with the timer of the correction controller 370 may be in conjunction with a time of charging the power storage unit 392. Initialization of resistors and so on is performed when initial charging is started, but the initialization of resistors and so on is not performed when any other charging is started.

As has been described, in the radio apparatuses according to the first to third embodiments, it is not necessary to have an A/D converter capable of performing multi-bit processing in a comparator. That is, a comparator capable of performing one bit processing will suffice, and a comparator for decoding a received signal and a comparator for offset correction can be combined. Accordingly, a radio with a small circuit scale and low power consumption can be provided.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A radio apparatus having an input terminal, comprising:
    a first amplifier to amplify a signal inputted to the input terminal with an amplification gain determined by a variable resistor to generate a first amplified signal;
    a first correcting unit to correct a direct current offset of the first amplifier;
    a second amplifier to amplify the first amplified signal to generate a second amplified signal;
    a second correcting unit to correct a direct current offset of the second amplifier;
    a reference voltage source or reference current source to supply a reference voltage or reference current for referring a direct current offset to the first amplifier and the second amplifier;
    a first switch to connect an input of the first amplifier to one of (i) the input terminal and (ii) either the reference voltage source or the reference current source;
    a second switch to connect an input of the second amplifier to one of (i) an output of the first amplifier and (ii) either the reference voltage source or the reference current source;
    a gain controller to control the amplification gain of the first amplifier; and
    a correction controller to (i) control the second switch to connect the input of the second amplifier to the reference voltage source or the reference current source so as to perform correction of the second correcting unit based on the second amplified signal obtained by supplying the reference voltage or the reference current to the input of the second amplifier, and thereafter, (ii) control the second switch to connect the input of the second amplifier to the output of the first amplifier and control the first switch to connect the input of the first amplifier to the reference voltage source or the reference current source so as to perform correction of the first correcting unit based on the second amplified signal obtained by supplying the reference voltage or the reference current to the input of the first amplifier while the amplification gain is set to maximum by the gain controller.

2. The radio apparatus of claim 1, further comprising a comparator to compare the second amplified signal of the second amplifier with a predetermined threshold and to convert the signal into a binary signal,
    wherein the correction controller controls correction of the first correcting unit and the second correcting unit based on the binary signal converted by the comparator.

3. The radio apparatus of claim 2,
    further comprising:
    a detecting unit to perform envelope detection of a received signal and give the signal to the input of the first amplifier; and
    a processor to decode the received signal based on the binary signal converted by the comparator.

4. The radio apparatus of claim 3, further comprising a power supply controller to control power supply to respective units based on a decoding result from the processor.

5. The radio apparatus of claim 1, wherein:
    the first correcting unit gives a first correction voltage or correction current to the first amplifier to correct the direct current offset of the first amplifier,
    the second correcting unit gives a second correction voltage or correction current to the second amplifier to correct the direct current offset of the second amplifier, and
    the correction controller generates the second correction voltage or correction current based on the second amplified signal of the second amplifier and gives the generated second correction voltage or correction current to the second correcting unit, and generates the first correction voltage or correction current based on the second amplified signal of the second amplifier the direct current offset of which is corrected with the generated second correction voltage or correction current and gives the generated first correction voltage or correction current to the first correcting unit.

6. The radio apparatus of claim 5, wherein each of the first correcting unit and the second correcting unit comprises a D/A converter, and
    wherein the correction controller gives a code outputting the first correction voltage value or correction current value and the second correction voltage value or correction current value in a digital signal to the first correcting unit and the second correcting unit.

7. The radio apparatus of claim 1, wherein the first amplifier comprises an attenuator attenuating an amplified output using a resistor.

8. The radio apparatus of claim 1, wherein the first amplifier comprises a feedback resistor feeding back an amplified output.

9. The radio apparatus of claim 1,
    further comprising a timer deciding a timing of correction control of the first correcting unit and the second correcting unit by the correction controller.

10. The radio apparatus of claim 2, wherein the correction controller controls correction of the first correcting unit and the second correcting unit based on a result of performing one of (i) sequential comparison processing on a binary signal converted by the comparator and (ii) majority judgment processing on comparison steps in sequential comparison.

11. A system, comprising:
    a power storage unit to store an electric power from a power source; and
    the radio apparatus of claim 1, which is operable by the electric power stored in the power storage unit.

12. A system, comprising:
    a power storage unit to store an electric power from a power source; and
    the radio apparatus of claim 1, which is configured to receive the signal by the electric power stored in the power storage unit when a power switch is turned off.

13. A system, comprising:
    the radio apparatus of claim 1; and
    a transmitter to transmit a radio signal to the radio apparatus,
    wherein the signal inputted to the input terminal is given by receiving the radio signal transmitted by the transmitter via an antenna.

14. The system of claim 13, wherein the transmitter is a remote controller.

15. The radio apparatus of claim 1, further comprising a rectifier to perform envelope detection of a received signal and to provide the received signal to the input of the first amplifier.

* * * * *